United States Patent [19]
Mikagi

[11] Patent Number: 5,539,256
[45] Date of Patent: Jul. 23, 1996

[54] SEMICONDUCTOR DEVICE HAVING AN INTERCONNECTION OF A LAMINATE STRUCTURE AND A METHOD FOR MANUFACTURING THE SAME

[75] Inventor: Kaoru Mikagi, Tokyo, Japan

[73] Assignee: NEC Corporation, Tokyo, Japan

[21] Appl. No.: 393,261

[22] Filed: Feb. 23, 1995

[30] Foreign Application Priority Data

Feb. 24, 1994 [JP] Japan .................................... 6-026672

[51] Int. Cl.$^6$ ................................................. H01L 23/48
[52] U.S. Cl. .......................... 257/763; 257/751; 257/753; 257/915
[58] Field of Search ..................... 257/751, 753, 257/762, 763, 764, 915

[56] References Cited

U.S. PATENT DOCUMENTS

| | | | |
|---|---|---|---|
| 4,866,008 | 9/1989 | Brighton et al. | 257/762 |
| 4,985,750 | 1/1991 | Hoshino | 257/762 |

FOREIGN PATENT DOCUMENTS

| | | |
|---|---|---|
| 49-3237 | 1/1974 | Japan . |
| 0605560 | 1/1985 | Japan ..................................... 257/915 |
| 63-156341 | 6/1988 | Japan . |

OTHER PUBLICATIONS

J. S. H. Cho et al., "Copper Interconnection with Tungsten Cladding for ULSI", pp. 39 and 40.

Kazuhide Ohno et al., "Fine Copper Pattern Formation Using RIE with a SiCl$_4$, N$_2$, Cl$_2$ and NH$_3$ Mixture, and Its Electromigration Characteristics", Abstract No. 318, pp. 486 and 487.

Y. Nakasaki et al., "Orientation Control of Cu Interconnects . . . Interfacial energy of Cu/Barrier Metal Structures", Abstract No. 30p–ZH–7, p. 707.

*Primary Examiner*—Mark V. Prenty
*Attorney, Agent, or Firm*—Young & Thompson

[57] ABSTRACT

A metallic interconnection has a laminate structure including a Ti film, a TiN film, a Cu—Ti compound film and a Cu alloy film containing Cu and a small amount of other metallic elements, the films being consecutively formed on a SiO$_2$ film located on a semiconductor substrate. A W film covers the surface of the laminate structure. The Cu—Ti compound film is formed by sputtering a Ti and a Cu alloy targets followed by a subsequent heat treatment or by sputtering Cu—Ti alloy target and a subsequent heat treatment. The Cu—Ti compound film increases the adhesion force between the Cu alloy film and the TiN film while the W film protects the metallic interconnection against oxidation and corrosion.

6 Claims, 8 Drawing Sheets

SEMICONDUCTOR DEVICE HAVING AN INTERCONNECTION OF A LAMINATE STRUCTURE AND A METHOD FOR MANUFACTURING THE SAME

BACKGROUND OF THE INVENTION (a) Field of the Invention:

The present invention relates to a semiconductor device having an interconnection of a laminate structure and a method for manufacturing the same and, more particularly, to a new laminate structure of an interconnection pattern in a semiconductor device.

(b) Description of the Related Art:

Some semiconductor devices have an interconnection pattern composed of a laminate structure including a main conductor of copper (Cu).

Figure 1A:
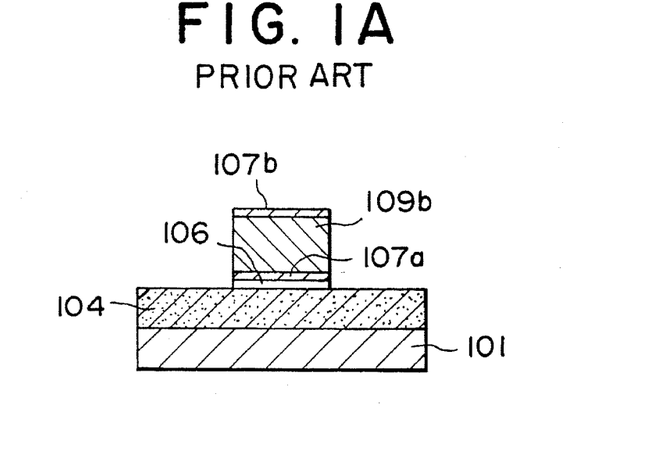
FIGS. 1A–1C are cross-sectional views of a first conventional interconnection structure in consecutive steps for fabrication thereof.
Figure 1B:
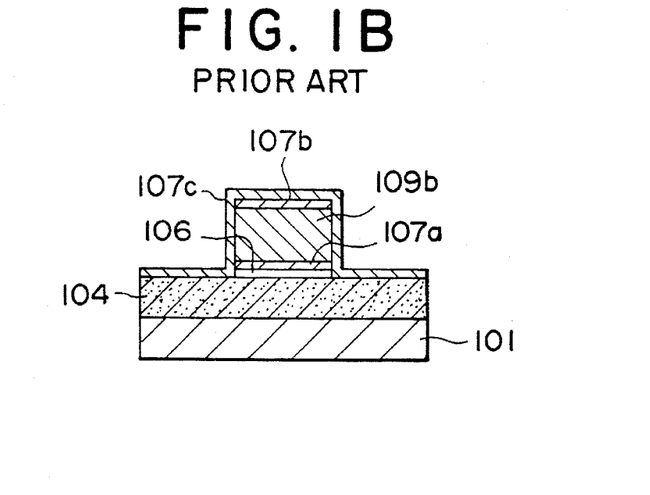
Figure 1C:
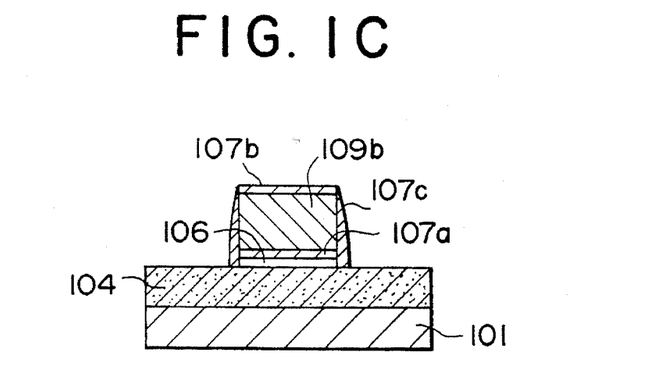

FIGS. 1A–1C shows cross-sectional views of a first conventional interconnection pattern in a semiconductor device in consecutive steps for fabrication thereof described in Publication No. JP-A-88-156341. First, a 50 nanometer (nm)-thick first titanium (Ti) film for making ohmic contacts with diffused regions of a semiconductor substrate 101, an 100 nm-thick first titanium nitride (TIN) film constituting a barrier layer against diffusion of Cu atoms, a 700 nm-thick Cu film constituting a main conducting layer and a 200 nm-thick second TiN Film constituting a barrier layer against the Cu diffusion are consecutively formed on a silicon dioxide ($SiO_2$) film 104 overlying a silicon (Si) substrate 101. Next, the second TiN film iS etched to form a film pattern 107b by a known technology. Then, the Cu film is etched to form a Cu pattern 109b by an ion-milling technology using the second TiN pattern 107b as a mask. The first TiN film and the first Ti film, both underlying the Cu pattern 109b, are etched to form TiN and Ti patterns 107a and 106 by a reactive ion etching (RIE) technology using a mixed gas composed of sulfur hexafluoride ($SF_6$) and oxygen ($O_2$) gases in a flow rate of 10:1. Thus the structure shown in FIG. 1A is obtained.

FIG. 1B shows the interconnection structure in a subsequent step after forming a 300 nm-thick TiN film 107c using a bias-sputtering technology on a top surface of the interconnection pattern, on sidewalls of the interconnection pattern and on a surface of the $SiO_2$ film 104. FIG. 1C illustrates the interconnection pattern in a step following an anisotropic RIE which has etched off the TiN film 107c located both on the $SiO_2$ 104 and on the top surface of the interconnection pattern to leave TiN film 107c only on the sidewalls of the interconnection pattern. As a result, a structure is obtained wherein substantially all surfaces of the interconnection pattern are coated and protected with the TiN films 107b and 107c, which guarantees a low resistivity and a long-term reliability of the interconnection. Alternatively, W, Mo, Ta, Cr films etc. may be used as a barrier metal against Cu diffusion instead of the TiN film as described above.

Figure 2A:
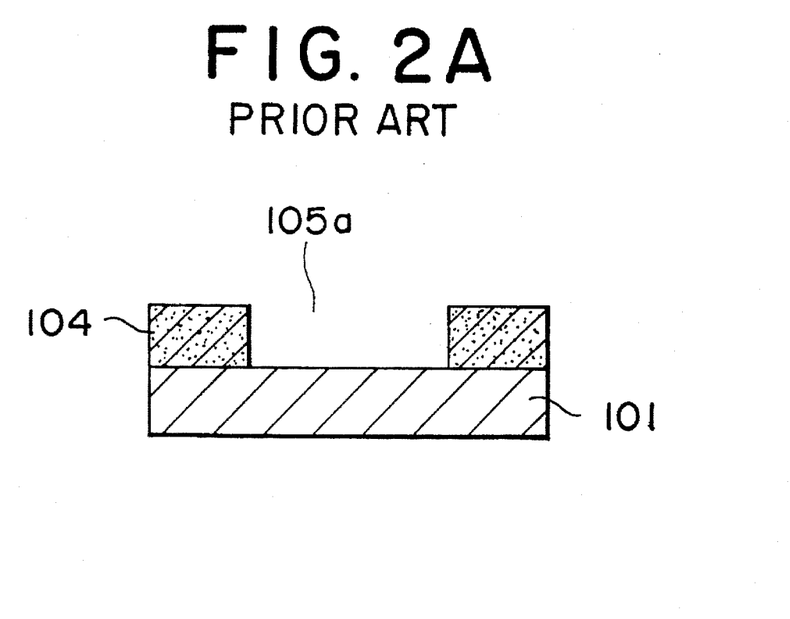
FIGS. 2A–2B are cross-sectional views of a second conventional interconnection structure in consecutive steps for fabrication thereof.
Figure 2B:
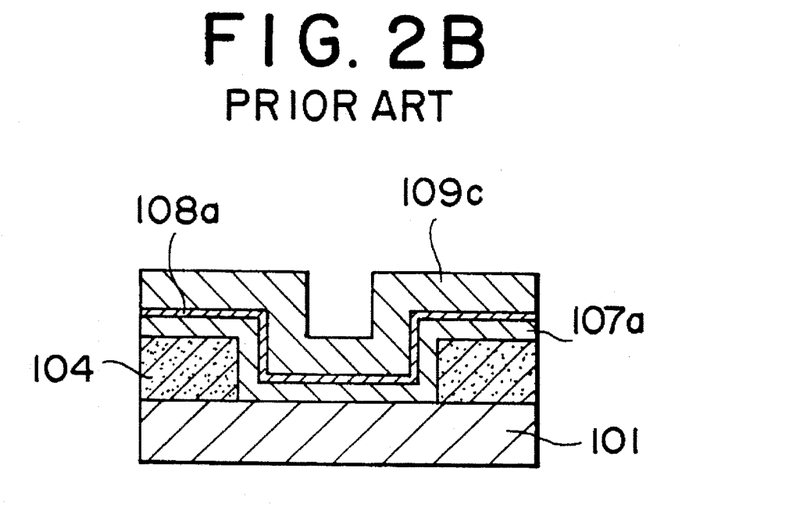

FIG. 2A and 2B are cross-sectional views of a second conventional interconnection pattern in consecutive steps for fabrication, which is disclosed in Publication No. JP-B-74-3237. As shown in FIG. 2A, a $SiO_2$ film is formed on a Si substrate 101 and patterned to form a film pattern 104 having a contact-hole 105a (a via-hole for a first-level interconnection, which will be referred to as a "via-hole" hereinafter) using a known technology. Subsequently, a TiN film 107a is formed on a surface of the $SiO_2$ film 104 and inside the via-hole 105a using a reactive sputtering technology, which is further followed by a step for consecutively forming a thin Ti film 108a and a gold (Au) film 109c constituting a main conductive layer as shown in FIG. 2B. The second Ti film 108a is provided to increase an adhesion force between the Au film 109c constituting a main conductive layer and the TiN film 107a constituting a barrier layer against Au diffusion.

Figure 3A:
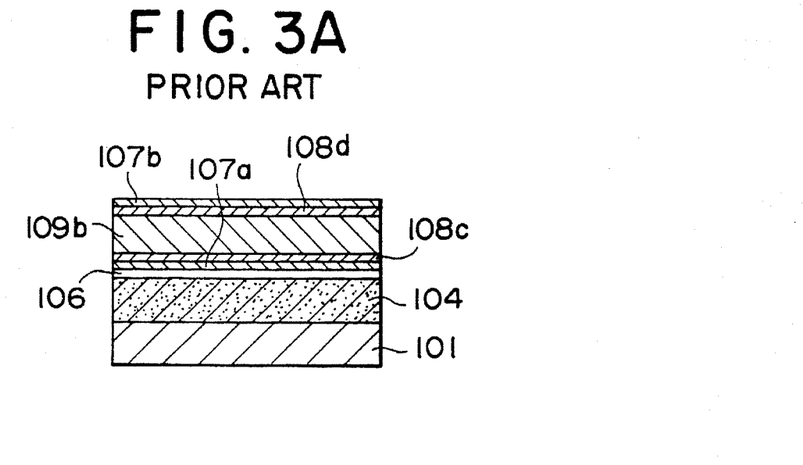
FIGS. 3A–3C are cross-sectional views of a third conventional interconnection structure in consecutive steps for fabrication thereof.
Figure 3B:
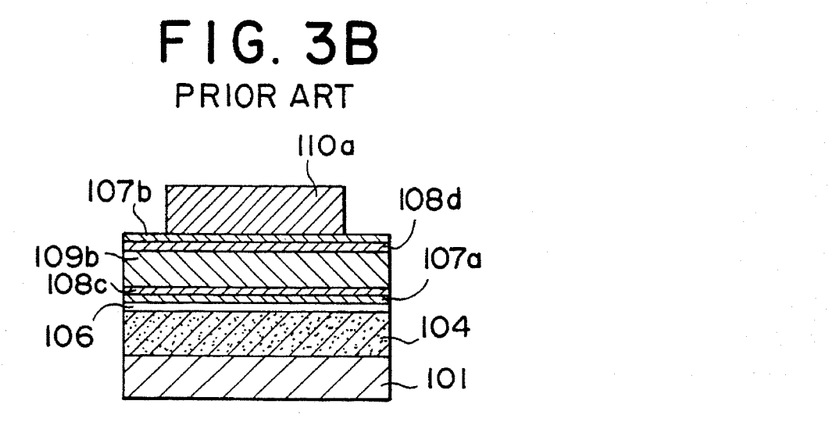
Figure 3C:
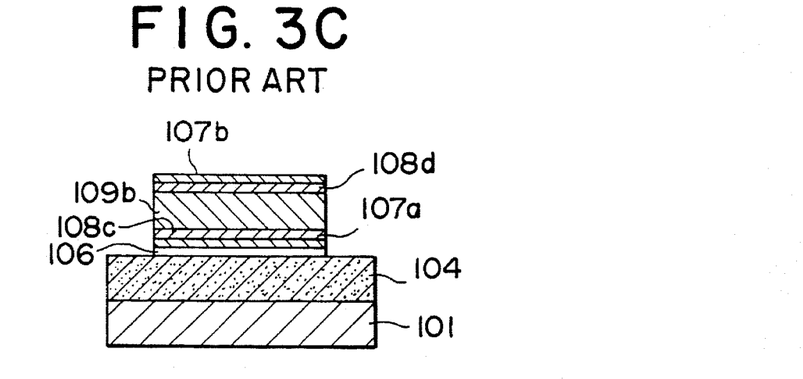

FIGS. 3A–3C are cross-sectional views of a third conventional interconnection pattern in consecutive steps for fabrication, which is reported by K. Ohno et al. in the Extended Abstracts of 183rd Electrochemical Society Meeting, Vol. 93-1, P. 468 (May of 1993). First, an about 500 nm-thick $SiO_2$ film 104 is formed on a Si substrate 101. A 30 nm-thick first Ti film 106 and an 100 nm-thick first TiN film 107a are tilth consecutively formed by using a sputtering and a reactive sputtering technologies, respectively.

Next, a 30 nm-thick first tungsten (W) film 108c and a 500 nm-thick Cu film 109b are consecutively formed using a sputtering technology. Then, a 30 nm-thick second W film 108d and a 50 nm-thick second TiN film 107b are consecutively formed on the Cu film 109b using sputtering technology, which provides a device structure shown in FIG. 3A.

Among the steps described above, the step for forming the first Ti film 106 is performed for reducing a contact resistance between a diffused region formed in the Si substrate 101 and the first TiN film 107a as well as for increasing an adhesion force between the $SiO_2$ film 104 and the first TiN film 107a. Here, the first and second TiN films 107a and 107b are provided for avoiding diffusion, oxidation and corrosion of Cu in the Cu film 109b. Those TiN films have also a function for improving durabilities against both electromigration and stressmigration, thereby obtaining a long-term reliability of the interconnection.

On the other hand, the W films 108c and 108d are provided for increasing the adhesion force between the Cu film 109b and the TiN films 107a and 107b. Unless the W films 108c and 108d exist between Cu film 109b and TiN films 107a and 107b, radicals including chlorine (Cl) atoms attack an interface between the Cu film 109b and the TiN films 107a and 107b to induce either side-etching or peeling-off of the TiN films 107a and 107b during the step for patterning the Cu film 109b performed at a high temperature using gases including chlorine atoms.

Subsequently, an about 400–500 nm-thick silicon nitride ($Si_3N_4$) film is formed on the TiN film 107b by a plasma-enhanced chemical vapor deposition (PE-CVD) technology. The $Si_3N_4$ film is then patterned employing a known photolithographic and dry etching technology to form a $Si_3N_4$ mask pattern 110a to be used for etching the metallic films, which provides a device structure shown in FIG. 3B.

Furthermore, an RIE step using gases composed of silicon tetrachloride ($SiCl_4$), $Cl_2$, nitrogen ($N_2$) and ammonia ($NH_3$) is performed to etch the laminate including the TiN film 107b, the W film 108d, the Cu film 109b, the W film 108c, the TiN film 107a and the Ti film 106 at a substrate temperature of 280° C., thereby obtaining an interconnection pattern as shown in FIG. 3C. During the RIE step, an extremely thin film having a composition approximately equal to the $Si_3N_4$ film is deposited on the sidewalls of the interconnection (unshown in the figures) as a by-product, which acts as a sidewall protective film for the Cu pattern 109b.

A fourth conventional interconnection pattern having a protective film for protecting a Cu surface against oxidation and corrosion is reported by J. Cho et al. in 11th Symposium on VLSI Technology, the Digest of Technical Papers, P. 39 (May of 1991). J. Cho illustrates two structures of Cu interconnection encapsulated in a protective film, a non-planar structure and a planar structure. FIGS. 4A–4D show cross-sectional views of an interconnection pattern of the non-planar structure mentioned above in consecutive steps for fabrication thereof while FIGS. 5A–5D similarly show an interconnection pattern of the planar structure as a fifth conventional structure.

Figure 4A:
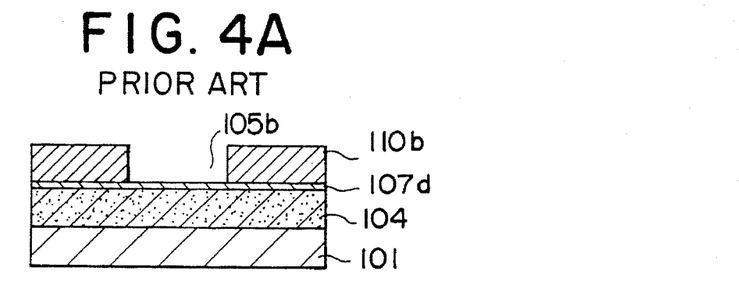
FIGS. 4A–4D are cross-sectional views of a non-planar structured fourth conventional interconnection structure in consecutive steps for fabrication thereof.
Figure 4B:
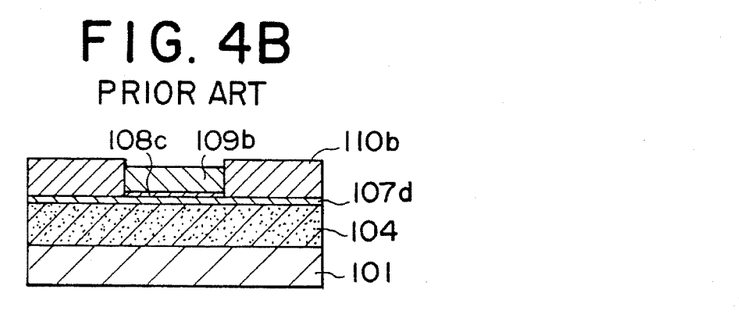

A first $SiO_2$ film 104 and a TiW film 107d are first formed consecutively on a Si substrate 101 as shown in FIG. 4A. Then, a second $SiO_2$ film is grown on the TiW film 107d at a low temperature, following which the second $SiO_2$ film is patterned by a known technology to form a $SiO_2$ mask pattern 110b having a trench 105b for temporarily accepting an interconnection.

Subsequently, a thin W film 108c is selectively grown on the TiW film 107d constituting the bottom surface of the $SiO_2$ trench 105b by a known technology of a selective W-CVD procedure. Thereafter, a Cu film 109b is selectively formed on the W film 108c by employing a Chemical-Mechanical-Polishing (CMP) of Cu film after non-selective Cu-CVD or a selective Cu-CVD technology, which provides a structure shown in FIG. 4B.

Figure 4C:
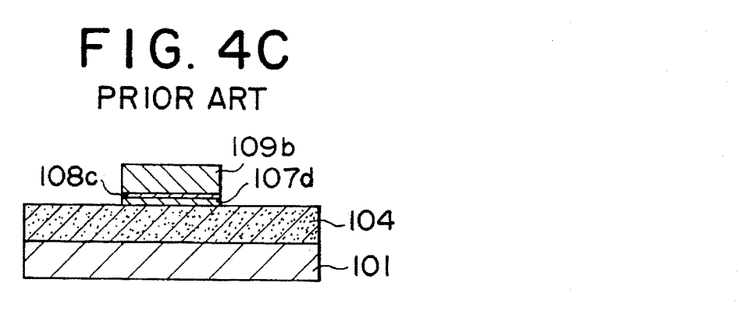
Figure 4D:
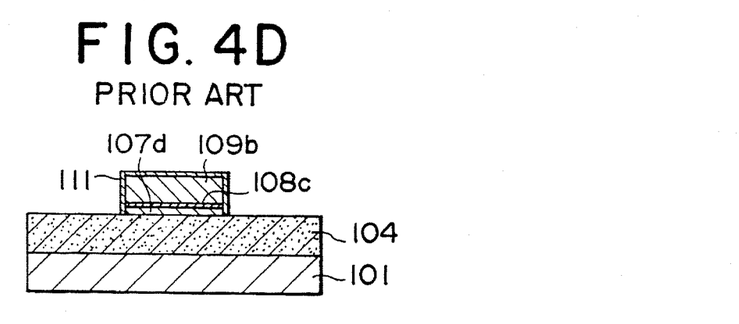

A subsequent etch-back of both the $SiO_2$ mask pattern 110b and the TiW film 107d by using the Cu film 109b as a mask provides an interconnection of a laminate structure including the TiW film 107d, the W film 108c and the Cu film 109b as shown in FIG. 4C. Subsequently, a W film 111 is formed covering the laminate structure by employing a selective W-CVD technology to protect the Cu film 109b against oxidation and corrosion as shown in FIG. 4D.

On the other hand, the aforementioned method for forming the planar structure shown in FIGS. 5A–5D similarly starts the process steps with formation of a first $SiO_2$ film 104 on a Si substrate 101. A second $SiO_2$ film is formed and patterned by employing a known technology to form a $SiO_2$ mask pattern 110b having a trench 105b for permanently embedding an interconnection. Then, a TiW film 107d is sputter-deposited covering the substantially entire surface to obtain a structure shown in FIG. 5A.

Figure 5A:
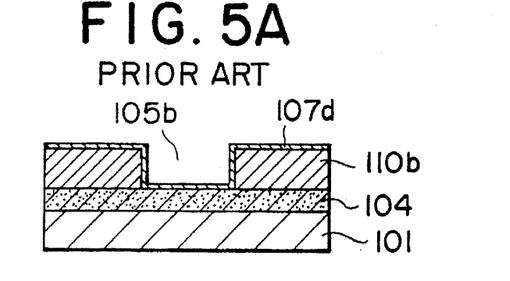
FIGS. 5A–5D are cross-sectional views of a planar structured fifth conventional interconnection structure in consecutive steps for fabrication thereof.
Figure 5B:
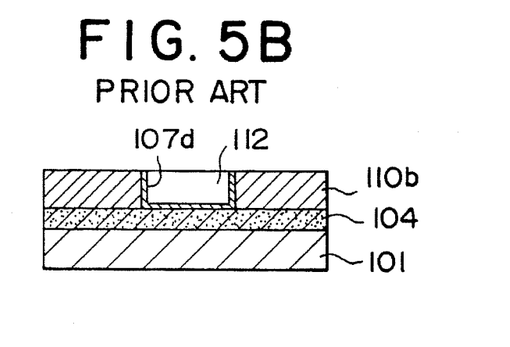
Figure 5C:
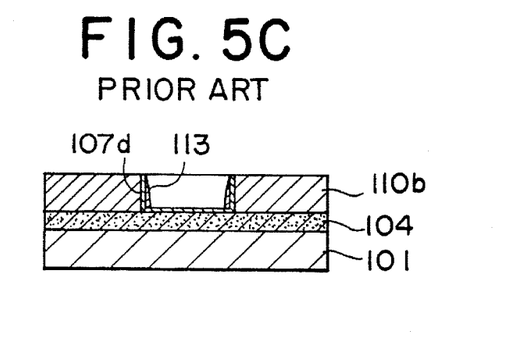
Figure 5D:
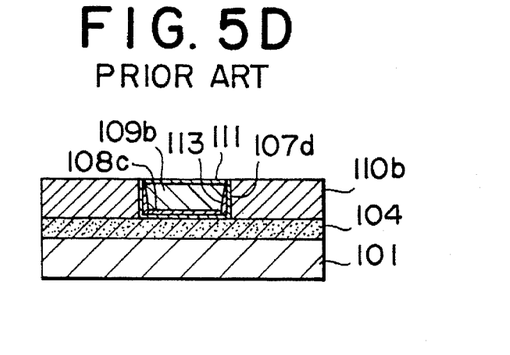

A photoresist film is formed covering the substantially entire surface by spin-coating. The photoresist film and the TiW film are then subjected to an etch-back under a condition that the photoresist film 112 and the TiW film 107d remain only inside the $SiO_2$ trench 105b as shown in FIG. 5B. Then, the photoresist film 112 is removed and a $Si_3N_4$ film is grown on the substantially entire surface, which is then subjected to an anisotropic etch-back under a condition to obtain $Si_3N_4$ sidewall spacers 113 remaining only on the inside sidewalls of the $SiO_2$ trench 105b as shown in FIG. 5C. FIG. 5D shows a final interconnection structure including a W film 108c, a Cu film 109b and a W film 108d formed on the TiW film 107d.

Figure 6A:
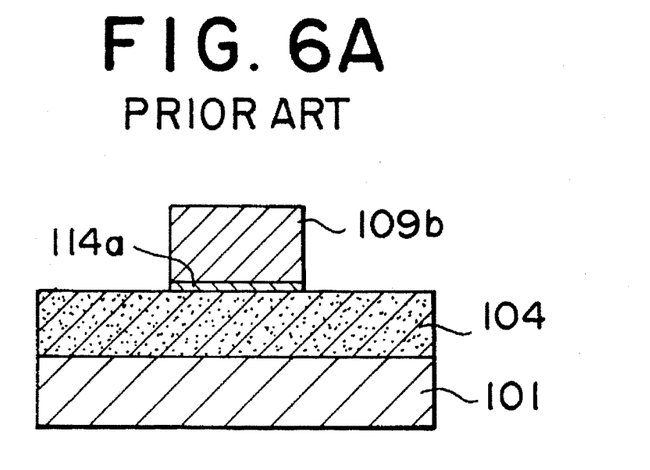
FIGS. 6A–6B are cross-sectional views of a sixth conventional interconnection structure in consecutive steps for fabrication thereof.
Figure 6B:
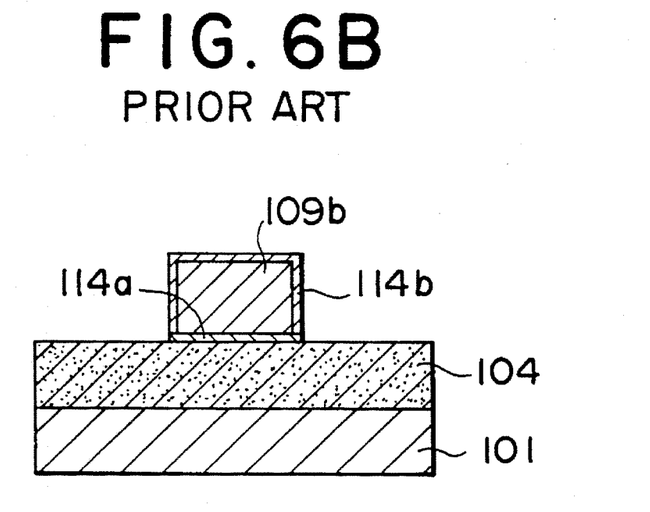

FIGS. 6A–6B are cross-sectional views of a sixth conventional interconnection structure in consecutive steps for fabrication thereof in which a niobium nitride (NbN) protective film is formed in a self-aligning manner for protecting the surface of a Cu interconnection. The structure is reported by H. Itoh et al. at 39th Spring Meeting of the Japan Society of Applied Physics and Related Societies, Vol. 2, P. 707, Presentation No. 30p-ZH-8 (1992).

The steps start with forming a $SiO_2$ film 104 on a Si substrate 101 followed by formation of a Nb film 114a and a Cu film 109b using a sputter-deposition and a patterning technologies as shown in FIG. 6A. Next, a heat treatment is performed at about 750° C. for half an hour in $N_2$ ambient to diffuse Nb atoms through Cu film 109b to a surface of the Cu film 109b and to form a NbN protective film 114b as shown in FIG. 6A. Nb atoms remain in the Cu film 109b to an extent of about 3 atomic (at) % after the heat treatment. However, the resistivity of the Cu Film 109b stays low, for instance, at 1.89 μΩ-cm. X-ray diffraction (XRD) analysis verifies that a crystallinity of the Cu film thus formed on the Nb film 114a shows a strong orientation tendency toward an (111) direction, which means a superior durability of thus formed interconnection pattern against both of electro- and stress-migrations.

The five species of conventional technologies mentioned above exhibit relatively good performances except for defects to be detailed later.

SUMMARY OF THE INVENTION

It is an object of the present invention to provide a semiconductor device having an interconnection structure of an excellent performance and a method for forming the same, the interconnection structure having mechanical, thermal and chemical durabilities and resistance against peeling-off of metallic interconnection films during fabrication, thereby obtaining a long-term reliability, high chip yield and production efficiency.

According to the present invention, there is provided a semiconductor device comprising: a semiconductor substrate; arm insulating film overlying the substrate; and a metallic interconnection of a laminate structure including a Ti film, a TiN film, a Ti—Cu compound film and a Cu alloy film including Cu and a minute amount of at least one metallic element other than Cu, the films being consecutively formed at least on the insulating film.

An ohmic contact having an especially excellent performance is obtained at the location where a metallic interconnection contacts with the main surface of the semiconductor substrate through a via-hole formed in the insulating film. It is preferable that the metallic interconnection includes additionally a W film which covers a substantially entire surface of the metallic interconnection.

It is also preferable that the at least one metal element is selected from a group consisting of zirconium (Zr), silver (Ag), tin (Sn) and antimony (Sb) as additive elements. On that occasion, it is further preferable that the content of the at least one metal element resides between 0.01 and 0.5 weight (wt) % in total of all additive metal elements.

Another preferred embodiment is that the Cu—Ti compound film has a composition ranging from Cu:Ti=5:1 to Cu:Ti=1:2 in atomic ratio.

The present invention further provides a method for manufacturing a semiconductor device including steps of: forming an insulating film overlying a semiconductor substrate; forming a Ti film on the insulating film; forming a TiN film on the Ti film; Forming a Cu—Ti compound film and a CU alloy film including Cu and a minute amount of at least one metallic element, the Cu—Ti compound film and Cu alloy film being consecutively laminated on the TiN film; and patterning the Cu alloy film, the Cu—Ti compound film, the TiN film and the Ti film to form an interconnection pattern.

In the step for consecutively forming the Cu—Ti compound layer and the Cu alloy layer, both layers may be formed independently from respective targets having appropriate compositions by employing a sputter-deposition technology. Alternatively, both layers may be formed in such a way that a second Ti layer and a Cu alloy layer are consecutively formed first on the TiN film, then converted to an intermetallic compound layer containing Cu and Ti by employing a successive heat treatment.

Because a semiconductor device according to the present invention or formed by a method according to the present invention has an interconnection of a laminate structure including a low resistive Cu alloy layer, a Ti film giving an excellent ohmic contact resistance, a TiN film acting as an excellent barrier layer against Cu diffusion and a Cu—Ti compound layer providing an excellent adhesion between itself and the Cu alloy film as well as between itself and the TiN film, the present invention provides a metallic interconnection having an excellent electric conductivity and ohmic contact as well as having an excellent mechanical, thermal and chemical durabilities so that peeling-off scarcely occurs in the laminated structure especially during manufacturing steps of the semiconductor device.

BRIEF DESCRIPTION OF THE DRAWINGS

The above and other objects, features an advantages of the present invention will be more apparent from the following description, taking in conjunction with accompanying drawings in which.

DESCRIPTION OF THE PREFERRED EMBODIMENTS

Before describing preferred embodiments of the present invention, the problems and disadvantages involved in the conventional methods will be described for a better understanding of the present invention.

A first conventional interconnection structure shown in FIGS. 1A–1C has a difficulty in application to an interconnection pattern having a minute spacing because it includes an ion-milling step for patterning a Cu film 106 and TiN films employed as sidewall spacers 107c. Moreover, an adhesion force between the Cu film 106 and the TiN films 107a, 107b and 107c is insufficient, so that it is difficult to obtain a high chip yield by production or a long-term reliability in device performance. A W film, if used as a barrier metal layer instead of the TiN film, will not provide solutions of the application difficulty to the minute patterns.

In the second conventional interconnection structure shown in FIGS. 2A–2B, a heat treatment step to be conducted after forming the Ti film 108a and the Au film 109c will cause a diffusion of Ti atoms into the Au film 109c, resulting in a reduction of a Ti concentration at the interface between the Ti film 108a and the Au film 109c because Ti atoms are generally liable to be solid-soluble into Au. The reduction in Ti concentration at the interface immediately lowers an adhesion force between the TiN film 107a and the Au film 109c because the Ti film 108a for improving the adhesion force initially has only a small thickness. Especially, a fabricating process for a multi-level interconnection structure includes many heat treatment steps, so that the Ti concentration at the interface will be extremely lowered, resulting in an almost unimproved adhesion force.

On the other hand, if an originally thick Ti film 108a is employed to increase the Ti concentration at the interface, the Ti concentration in the Au film 109c will be higher, resulting in a high resistivity of the Au film 109c. Those situations are similar even if the Au film 109c is replaced by a Cu film because a heat treatment will cause diffusion of Ti atoms into the Cu film, resulting in substantially unimproved adhesion force.

The third conventional interconnection structure shown in FIGS. 3A–3C employs an laminate structure including as many as six layers, which raises manufacturing cost and lowers the chip yield because of the complex process.

Further, a thin protective film made of a by-product having a composition similar to $Si_3N_4$ and protecting sidewalls of the Cu interconnection 109b has poor chemical and thermal stabilities, so that it cannot guarantee a long-term reliability. Such an interconnection exhibits neither an excellent thermal durability nor a long-term reliability because of the protective film-induced corrosion and oxidation in the Cu film.

The non-planar structure of the fourth conventional interconnection structure shown in FIGS. 4A–4D has a TiW film 107d on the bottom surface of a $SiO_2$ trench 105b during a patterning step of the trench 105b as a receptacle of the interconnection. Process conditions wherein the $SiO_2$ film 110b is selectively etched off from the TiW film 107d are difficult to define especially when underlying layers have a step or shoulder because the TiW film scarcely acts as an etch-stopper.

Furthermore, in a case when both the $SiO_2$ film 110b and the TiW film 107d are patterned by employing an RIE technology using a Cu film 109b as a mask, the surface of the Cu film 109b is liable to be corroded to degrade electric characteristics, being exposed into the plasma of the reaction gases. CMP and ion-milling technologies are difficult to apply to the etching step mentioned above from the standpoints of an etch-selectivity and a chemical durability in the Cu film 109b.

The planar structure of the fifth conventional interconnection structure shown in FIGS. 5A–5D includes a step of etching back a TiW film 107d using a photoresist film residual inside a $SiO_2$ trench 105b. However, the photoresist film is generally too thin on a higher side of a step or shoulder formed by an underlying layer while too thick on a lower side of the step if the step is high. Accordingly, it is difficult to set an adequate etch back condition wherein the TiW film 107d is left only inside the trench 105b.

Moreover, all of the Cu film 109b and the W films 108c and 111 underlying and overlying the Cu film 109b, respectively, cannot be grown without employing selective CVD technologies. The step for forming the three layer-structure by employing a selective CVD technology is neither easy nor practical because it is extremely difficult to find a condition which guarantees an excellent selectivity therein.

In the sixth conventional interconnection structure shown in FIGS. 6A–6B, the heat treatment for forming a NbN film 114b is conducted at a high temperature as high as 750° C., so that the contact electrode for contacting with a surface of a diffused region absorbs diffused dopant atoms and even destroys a PN junction due to a metallic diffusion and a silicidation reaction, resulting in a degradation of semiconductor device characteristics although a protection of a Cu surface using a NbN film itself provides an excellent reliability. As a result, it causes another problem that a semiconductor device having excellent characteristics, especially a device having a minute design rule or a shallow junction, is difficult to obtain.

Now, preferred embodiments of the present invention will be described with reference to the drawings. A semiconductor device according to a first embodiment of the present invention has an interconnection pattern illustrated in FIGS. 7A–7F showing consecutive steps for fabrication thereof. First, known LOCOS and ion-implantation technologies are applied to form a field oxide film 102 and a diffused region 103 on a main surface of a Si substrate 101. Then, an about 1000 nm-thick oxide film 104 is formed overlying the field oxide film 102 and the diffused region 104 by use of a thermal CVD technology. The oxide film 104 is not necessarily a pure $SiO_{20}$ film but may be a doped oxide film containing boron or phosphorus atoms such as a phospho-silicate glass (PSG) or a boro-phospho-silicate glass (BPSG). A subsequent; step for forming a via-hole 105a in the $SiO_2$ film 104 by using an RIE technology provides a structure shown in FIG. 7A.

Figure 7A:
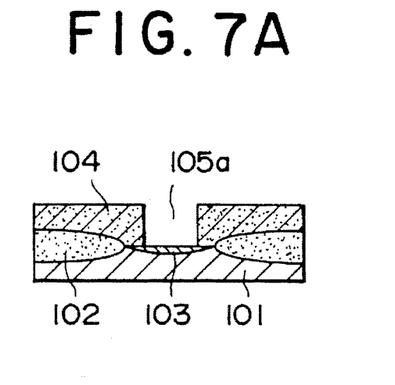
FIGS. 7A–7F are cross-sectional views of an interconnection structure in a semiconductor device according to a first embodiment of the present invention in consecutive steps for fabrication thereof.
Figure 7B:
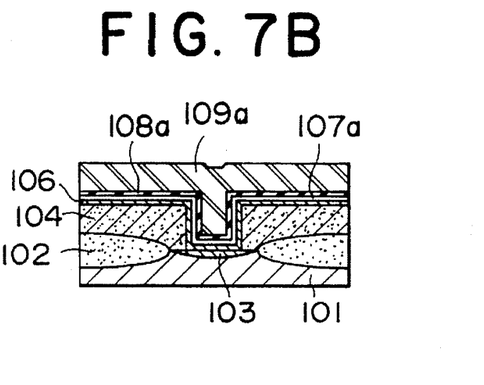

Then, conductive films composed of a 30 nm-thick first Ti film 106, a 100 nm-thick TiN film 107a, a 5–10 nm-thick second Ti film 108a and a 400 nm-thick Cu alloy film 109a are consecutively formed using a DC-magnetron sputtering and a DC-magnetron reactive ion sputtering technologies to give a structure shown in FIG. 7B. The Cu alloy film 109a contains at least one additive metallic element selected from a group consisting of Zr, Ag, Sn and Sb, the content of the additive metallic element being between 0.01 and 0.1 wt % in total.

The First Ti Film 106 is provided to reduce a contact resistance between the resultant interconnection and the diffused region 108 as well as to increase an adhesion force between the $SiO_2$ film 104 and the TiN film 107a. The TiN film 107a is provided to block metallic atoms diffusing out of metallic films into the underlying diffused region 103 and to improve an electromigration durability and a stress-migration durability of the resultant interconnection structure. The addition of the metallic elements such as Zr, Ag, Sn or Sb into Cu improves the mechanical strength, the thermal stability and the oxidation durability of the Cu layer.

Addition of Zr into the Cu film, for example, at a rate of 0.01 wt % improves the tensile strength up to 35–45 $kgf/mm^2$ while a pure metallic Cu film has only 20–25 $kgf/mm^2$ in tensile strength. On the other hand, a Cu alloy film containing 0.01 wt % Zr exhibits 450° C. in recrystallization temperature thereby improving thermal stability while the recrystallization temperature of a pure Cu film is 150° C.

Generally, the free energy for forming a zirconium oxide ($ZrO_2$) is far lower than those of cupric and cuprous oxides (CuO and $Cu_2O$), respectively, which means that Zr is more readily oxidized than Cu. Accordingly, the oxidation durability of Cu is improved by addition of Zr atoms because Zr atoms are oxidized instead of Cu atoms in the Cu alloy. The improvement in mechanical strength and thermal durability also originates from $ZrO_2$. Namely, if $ZrO_2$ exists in a Cu film, the $ZrO_2$ traps dislocation loops in a Cu crystal to suppress migration of Cu atoms and diffusion of Cu atoms, thereby improving mechanical strength and thermal durability of the Cu film. Along with those improvements, it also improves both electromigration and stressmigration durabilities although Zr slightly lowers electric conductivity of the Cu film. For instance, addition of 0.1 wt % Zr into a Cu film induces a 3–6% reduction in electric conductivity.

Mechanical strength and thermal durability are also improved similarly to the case of Zr when metallic Ag is introduced into a Cu Film at an extent of 0.01–0.1 wt %. For instance, a tensile strength of a Cu alloy film containing 0.05 wt % Ag exceeds 45 $kgf/mm^2$ while a recrystallization temperature rises up to 320° C., Reduction in electric conductivity is far smaller than the case of Zr, for example, only 1–3% reduction at most in case of 0.1 wt % Ag although Ag provides only moderate improvement in oxidation durability.

When 0.01 wt % Sn or Sb is added, recrystallization temperature of Cu rises by 50–150° C. while mechanical characteristics thereof are improved remarkably. However, those additions exhibit only moderate improvement in oxidation durability while induce a slight reduction in conductivity of Cu film at an extent of 2–4%.

As described above, addition of Zr, Ag, Sn and/or Sb atoms in minute amount can improve mechanical, thermal and chemical characteristics of a Cu film, substantially without degrading electric characteristics of the Cu film.

Figure 7C:
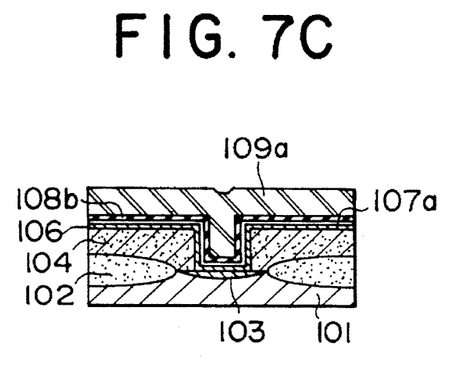

Subsequently, rapid thermal annealing (RTA) is conducted in a $N_2$ ambient at a temperature ranging between 600 and 700° C. for 10–30 seconds by use of a lamp annealing apparatus to provide a structure shown in FIG. 7C. The heat treatment forces the First Ti film 106, contacted with the diffused region 103, to react with Si to thereby form a Ti silicide ($TiSi_2$) layer as well as forces unreacted Ti atoms remaining in the TiN film 107a to react with unreacted $N_2$ remaining also in the TiN film 107a, to thereby stabilize the TiN film 107a. The beak treatment also forces the second Ti film 108a to react with the Cu alloy film 109a to form a 20–40 nm-thick Cu—Ti compound layer 108b including intermetallic compounds. The silicidation of the Ti film lowers a barrier height of a Schottky junction between a metallic film (the first Ti film 106) and a semiconductive material (the diffued region 103), resulting in a reduction in contact resistance and a rise in a barrier ability of the TiN film 107a against Cu diffusion due to stabilization of the TiN film 107a.

There are seven species of intermetallic compounds contained in the Cu—Ti compound layer 108b formed between the Cu alloy film 109a and the TiN film 107a, including unconfirmed substances. The compound species include $Cu_4Ti$ (unconfirmed), $Cu_7Ti_2$ (unconfirmed), $Cu_3Ti$ (unconfirmed), $Cu_2Ti$, $Cu_3Ti_2$ and $CuTi_2$. The compound species, crystalline structures and the film thickness of the Cu—Ti compound layer 108b depend on a film thickness of the second Ti film 108a and on conditions of the RTA step. However, a Cu—Ti compound layer including a higher Cu content is formed at the interface because a solid solubility of Ti atoms in a Cu phase at 600° C. is basically higher than that of Cu atoms in a Ti phase at the temperature. On that occasion, addition of Zr, Ag, Sn or Sb atoms does not provide a substantial effect on a reaction of the Cu—Ti intermetallic compound Formation because its amount is minute.

The Cu—Ti compound layer 108b acts as an adhesion promoting layer between the TiN film 107a and the Cu alloy film 109a due to its excellent adhesion force toward each of TiN and Cu films as well as act as a barrier layer against Cu diffusion due to its excellent thermal stability. Formation of the Cu—Ti compound layer 108b between the TiN film 107a and the Cu alloy film 109a can prevent side-etching of the TiN film 107a and peeling-off of the TiN film 107a from the Cu alloy film 109a during dry etching of the Cu alloy film.

Figure 7D:
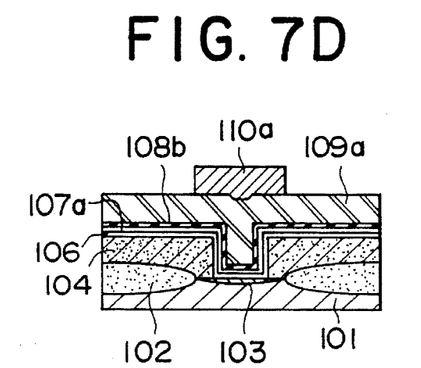

FIG. 7D illustrates the interconnection structure after forming a $Si_3N_4$ mask pattern 110a for patterning laminated conductive films. A 300–500 nm-thick $Si_3N_4$ film is first grown on the Cu alloy film 109a by employing a PE-CVD reaction of source gases including silane ($SiH_4$) and $NH_3$ under a condition of substrate temperature at 300°–350° C., reaction pressure at 0.2–0.5 Torr, $SiH_4$ flow rate at 150–800 standard cubic centimeter (sccm), $NH_3$ flow rate at 400–800 sccm and RF power supply of 0.5–1.5 kW. Then, by known photolithographic and dry etching technologies, the $Si_3N_4$ film is patterned to form the mask pattern 110a. The thickness of the $Si_3N_4$ mask pattern 110a is decided, with etch selectivity of the laminated conductive films to the $Si_3N_4$ mask pattern 110a being taken into consideration.

Figure 7E:
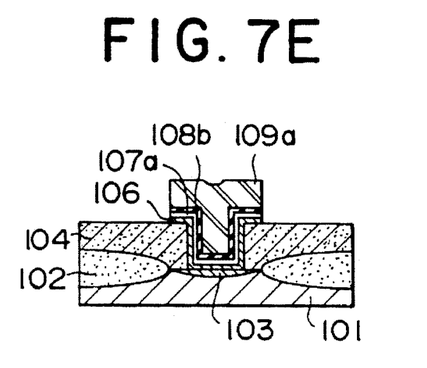

FIG. 7E shows the interconnection structure after etch-back of the conductive laminate including the Cu alloy film 109a, the Cu—Ti compound layer 108b, the TiN film 107a and the first Ti film 106. The etch-back is conducted using an RIE technology employing $SiCl_4+Cl_2+NH_3$ as reaction gases and $N_2$ as a diluent gas tinder a condition of substrate temperature at about 280° C., ambient pressure at about 2 Pa, $SiCl_4$ flow rate at about 20 sccm, $Cl_2$ flow rate at about 20 sccm, $NH_3$ flow rate at 10–30 sccm, $N_2$ flow rate about 80 sccm and RF power supply at 300 W. Then, the $Si_3N_4$ mask pattern 110a remaining on the top Cu alloy film 109a is removed by employing an RIE technology at a high etch-selectivity of the $Si_3N_4$ film to the $SiO_2$ film 104.

On the etching step of the conductive laminate described above, substantially neither side-etch of the TiN film 107a nor peeling off thereof at an interface between the Cu alloy film 109a and the TiN film 107a occurs because of the large adhesion force between the Cu alloy film 109a and the Cu—Ti compound layer 108b and between the Cu—Ti compound layer 108b and the TiN Film 107a. Hence, it is unnecessary to form an intervening layer such as a W film required in conventional arts for improving an adhesion, which simplifies both an interconnection structure and the process for forming the same while obtaining a further more minute interconnection pattern.

Figure 7F:
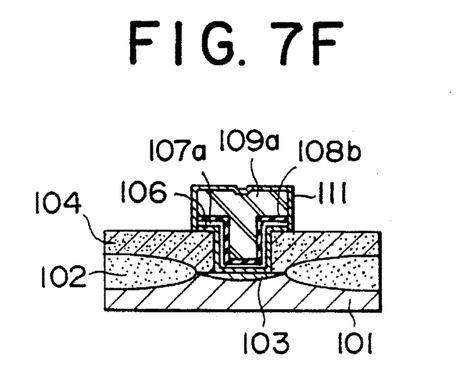

FIG. 7F illustrates a final interconnection structure metallugically passivated by covering the laminate interconnection with an about 20 nm-thick W film 111. The passivation is conducted employing a selective W-CVD technology using a hydrogen ($H_2$) gas as a reductant. To obtain a uniform W film 111 covering the interconnection pattern and a high selectivity, two species of pre-treatments are preferably conducted. One is immersion of the Si wafer into a diluted (dil.) hydrofluoric acid (HF) of 0.5–3 volume (vol) %. Another is dipping thereof into a solution capable of etching a Cu film such as a dil. sulfuric acid ($H_2SO_4$) of 5–30 vol %, nitric acid ($HNO_3$), aqua regia or a mixed acid between $HNO_3$ and a phosphoric acid ($H_3PO_4$).

The HF treatment is directed to remove a film having a stoichiometric composition approximately equal to $Si_3N_4$ deposited as a by-product on the surface of the second $SiO_2$ film 104 suffered from ionic damages and on sidewalls of the laminate interconnection, thereby providing an improvement in selectivity in the W-CVD step. The treatment by Cu etching solutions is directed to remove a damaged layer induced on the Cu alloy film surface 109a during the RIE for obtaining $Si_3N_4$ pattern 110a as a mask. The treatment provides a uniform nucleation and film growth during a selective W-CVD.

Growth conditions set For the selective W-CVD are substrate temperature between 350° and 400° C., reaction pressure at 20–80 mTorr, flow rate of tungsten hexafluoride ($WF_6$) at 0.5–1 sccm and $H_2$ flow rate between 200 and 400 sscm. Although the W growth rate depends basically on an exposed ratio of a metallic interconnection surface to an oxide surface in area, above-described conditions provide a comparatively low W growth rate, for example about 5–7 nm/min, thereby well controlling the thickness of the W film.

The interconnection structure as described above has the Cu—Ti compound layer 108b for improving the adhesion force and the barrier function between the Cu alloy film 109a and the TiN film 107a. Besides, the Cu alloy film 109a having a mechanical strength and a thermal durability higher than those of a pure Cu film provides excellent mechanical and thermal characteristics. Moreover, the W film 111 protecting Cu against an oxidation and a corrosion provides a long-term reliability of the interconnection thus obtained, which the interconnection structure and the manufacturing steps thereof are not complex as compared with those of the conventional arts.

The semiconductor device according to the first embodiment of the present invention and the method for forming the same are widely applicable to a variety of kinds of devices and circuits whether the devices may be MOS or bipolar ones and whether the circuits may be memory or logic ones.

Figure 8A:
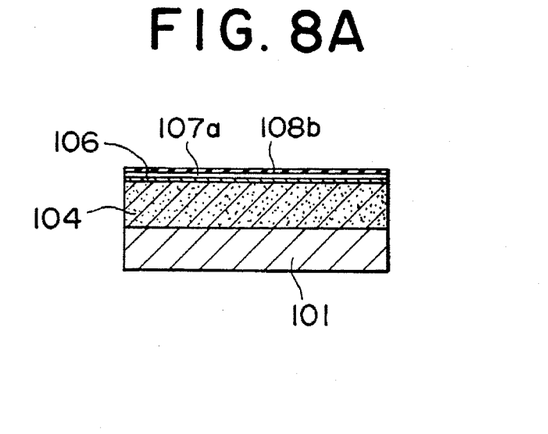
FIGS. 8A–8E are cross-sectional views of an interconnection structure in a semiconductor device according to a second embodiment of the present invention in consecutive steps for fabrication thereof.

Now, a second embodiment of the present invention will be described with reference to FIGS. 8A–8E. A 500–1000 nm-thick $SiO_2$ film 104 is first formed on a Si substrate 101 by employing a thermal CVD or a PE-CVD, then a 30 nm-thick first Ti film 106 and an 100 nm-thick TiN film 107a are consecutively formed on the $SiO_2$ film 104. Next, an about 10 nm-thick Cu—Ti alloy film is Formed by a DC-magnetron sputtering technology employing a Cu—Ti alloy as a target, following which a heat treatment is carried out in an inoxidizing ambient at 400°–600° C. to convert the Cu—Ti alloy film to a Cu—Ti intermetallic compound film 108b as shown in FIG. 8A. Cu content in the Cu—Ti compound film 108b is high if Cu content in the Cu—Ti alloy target is high although the final Cu composition depends basically not only on a target composition but also on the conditions in the heat treatment. It is preferable to select the composition in the Cu—Ti alloy target between 2:1 and 3:2 in Cu-to-Ti ratio.

The first Ti film 106 is provided to improve an adhesion force between the $SiO_2$ film 104 and the TiN film 107a. The TiN film 107a is provided to guarantee a long-term reliability of the resultant interconnection such as an electromigration or a stressmigration immunity.

Figure 8B:
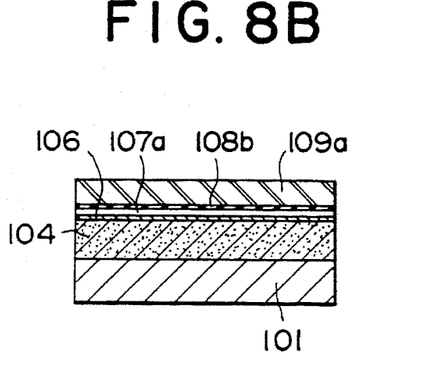

Subsequently, a 400 nm-thick Cu alloy film 109a containing at least one of metals selected a group consisting of Zr Ag, Sn and Sb at an extent of 0.01–0.1 wt % is formed by employing a DC-magnetron sputtering technology as shown in FIG. 8B. Addition of Zr, Ag, Sn and/or Sb atoms into the Cu film is directed to improve mechanical strength, thermal stability and oxidation durability of the Cu Film, the function of the additive elements being similar to the case of the first embodiment.

Since the Cu content in the Cu—Ti intermetallic compound layer 108b is high as described above, the Cu—Ti compound layer 108b has a high thermal durability and a melting point 900° C. Consequently, the Cu—Ti compound layer 108b acts not; only as an adhesion layer between the Cu alloy film 109a and the TiN film 107a but also acts as a barrier layer against Cu diffusion between the two films. Accordingly, a high thermal durability and an excellent adhesion force are consistent. As a result, side-etch and peeling-off of the TiN film is avoided also in the second embodiment.

Figure 8C:
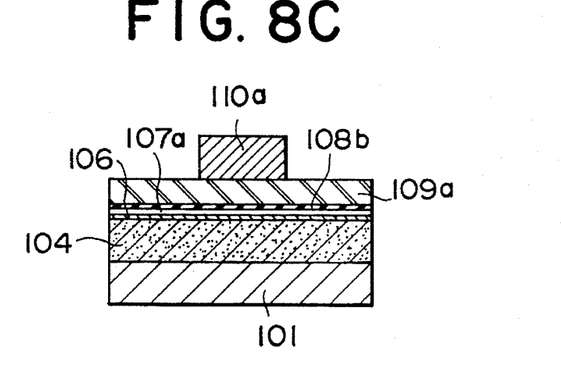

FIG. 8C illustrates the interconnection structure after forming a $Si_3N_4$ mask pattern 110a. First, a 300–500 nm-thick $Si_3N_4$ film is formed on the Cu alloy film 109a by a PE-CVD technology employing $SiH_4$ and $NH_3$ as source gases at a condition of substrate temperature between 300° and 350° C., reaction pressure at 0.2–0.4 Torr, $SiH_4$ flow rate between 150 and 300 sccm, $NH_3$ flow rate between 400 and 800 sccm and an RF power supply at 0.5–1.5 kW. Subsequently, the $Si_3N_4$ film is patterned to form the mask pattern 110a. The thickness of the $Si_3N_4$ mask pattern 110a is decided, with the etch-selectivity of the laminate conductive layers to the $Si_3N_4$ film being taken into consideration.

Figure 8D:
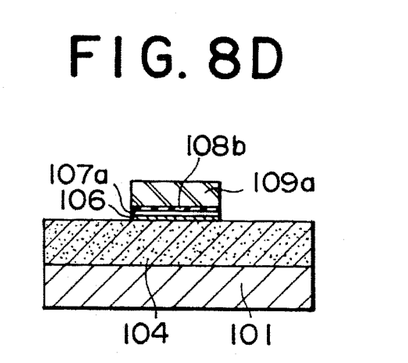

Next, the laminate including the Cu alloy film 109a, the Cu—Ti compound layer 108b, the TiN film 107a and the Ti film 106 is patterned to form an interconnection structure by RIE employing $SiCl_4$, $Cl_2$, $NH_3$ and $N_2$ as source gases and a diluent gas at a condition of substrate temperature at about 280° C., reaction pressure at 2 Pa, $SiCl_4$ flow rate at about 20 sccm, $Cl_2$ flow rate at about 20 sccm, $NH_3$ flow rate between 10 and 30 sccm, $N_2$ flow rate at about 80 sccm and RF power supply of 300 W. The $Si_3N_4$ mask pattern 110a remaining on the Cu alloy film 109a is then removed by employing RIE procedure under a condition wherein the selectivity of the $Si_3N_4$ film 110a to the $SiO_2$ film 104 is high enough to obtain substantially zero etch of the $SiO_2$ film 104, resulting in an intermediate structure as shown in FIG. 8D.

An excellent adhesion force is guaranteed between the Cu alloy film 109a and the Cu—Ti compound layer 108b as well as between the Cu—Ti compound film 108b and the TiN film 107a. Accordingly, a side-etching of the TiN film 107a and peeling-off thereof from the Cu alloy film 109a will scarcely arise during the RIE step for the Cu alloy film 109a. As a result, it is not necessary to provide an additional layer such as a W film for improvement in an adhesion between the Cu film and the TiN film, which simplifies an interconnection structure and steps for manufacturing.

Figure 8E:
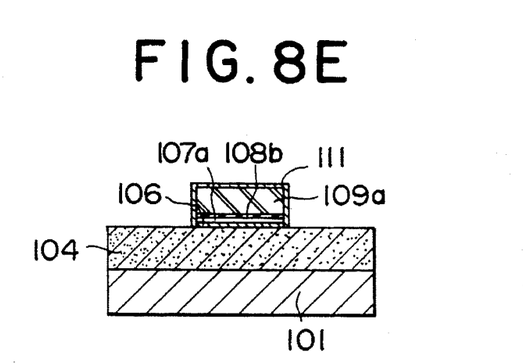

Subsequently, an about 20 nm-thick W film 111 is formed only on a surface of the interconnection by employing a selective W-CVD technology using $H_2$ as a reductant to passivate metallugically the interconnection surface as shown in FIG. 8E. It requires two species of pre-treatments prior to forming the W film 111 having a high selectivity and a high uniformity. Purposes and procedures of the pre-treatments are similar to those of the first embodiment.

Selective W-CVD is conducted under a condition of substrate temperature at 350°–400° C., reaction pressure at 20–80 mTorr, $WF_6$ flow rate between 0.5 and 1 sccm and $H_2$ flow rate at 200–400 sccm. Thus formed W film exhibits a comparatively small growth rate of about 5–7 nm/min in accordance with an exposure rate of the interconnection surface area to the surface area of the $SiO_2$ film 104. The small growth rate is suitable to control the thickness of the W film 111.

An interconnection structure formed according to the second embodiment provides the Cu—Ti intermetallic compound layer for thereby improving the adhesion force between the Cu alloy film and the TiN film therebetween. Besides, the Cu alloy film having a mechanical strength and a thermal durability higher than those of a pure Cu film improves the mechanical and thermal strength of the interconnection. Moreover, the interconnection surface is protected by a selective W-CVD film against oxidation and corrosion. As a result, a long-term reliability of the interconnection is obtained by the present invention.

In the second embodiment, a Cu—Ti compound layer is formed by sputter-depositing a Cu—Ti alloy and annealing. However, the Cu—Ti compound layer may be formed by sputtering a Cu—Ti compound target.

Although the present invention is described with reference to the preferred embodiments, the present invention is not limited to such embodiments and it will be obvious for those skilled in tire art that various modifications or alterations can be easily made based on the above embodiments within the scope of the present invention.

What is claimed is:

1. A semiconductor device comprising:
    a semiconductor substrate; an insulating film overlying said substrate; and a metallic interconnection of a laminate structure including a Ti film, a TiN film, a Ti—Cu compound film and a Cu alloy film including Cu and a minute amount of at least one metallic element selected from a group consisting of Ag, Sn and Sb, said films being consecutively formed at least on said insulating film.

2. A semiconductor device as defined in claim 1 wherein said metallic interconnection has a via-plug penetrating said insulating film and said via-plug forms an ohmic contact with said semiconductor substrate.

3. A semiconductor device as defined in claim 1 wherein said interconnection further includes a W film covering said laminate structure.

4. A semiconductor device comprising: a semiconductor substrate; an insulating film overlying said substrate; and a metallic interconnection of a laminate structure including a Ti film, a TiN film, a Ti—Cu compound film and a Cu alloy film including Cu and an amount between 0.01 and 0.5 wt. % of at least one metallic element other than Cu, said films being consecutively formed at least on said insulating film.

5. A semiconductor device comprising: a semiconductor substrate; an insulating film overlying said substrate; and a metallic interconnection of a laminate structure including a Ti film, a TiN film, a Ti—Cu compound film at an atomic ratio ranging between Cu:Ti=5:1 and Cu:Ti=1:2 and a Cu alloy film including Cu and a minute amount of at least one metallic element other than Cu, said films being consecutively formed at least on said insulating film.

6. A semiconductor device comprising: a semiconductor substrate; an insulating film overlying said substrate; and a metallic interconnection of a laminate structure including a Ti film, a TiN film, a Ti—Cu compound film at an atomic ratio ranging between Cu:Ti=7:2 and Cu:Ti=1:2 and a Cu alloy film including Cu and a minute amount of at least one metallic element other than Cu, said films being consecutively formed at least on said insulating film.

* * * * *